(12) United States Patent
Xia et al.

(10) Patent No.: US 6,360,685 B1
(45) Date of Patent: *Mar. 26, 2002

(54) SUB-ATMOSPHERIC CHEMICAL VAPOR DEPOSITION SYSTEM WITH DOPANT BYPASS

(75) Inventors: Li-Qun Xia, San Jose; Ellie Yieh, Millbrae, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,561

(22) Filed: May 5, 1998

(51) Int. Cl.[7] .......................... C23C 16/00; H05H 1/00
(52) U.S. Cl. ................. 118/723 ME; 118/723 MW; 118/697; 118/695; 156/345
(58) Field of Search ................ 118/723 R, 723 ME, 118/723 MR, 223 ME, 695, 697, 723 MW, 715; 156/345 P, 345; 427/587, 588, 593

(56) References Cited

U.S. PATENT DOCUMENTS 5,648,175 A   7/1997  Russell et al. ........... 428/472.3
5,935,334 A * 8/1999  Fong et al. ............. 118/723 R

FOREIGN PATENT DOCUMENTS

EP          307 995       3/1989
JP          5-291144      5/1993
WO          WO 97/24755   7/1997

OTHER PUBLICATIONS

U.S. application No. 08/982,872, Srinivas et al., filed Aug. 1999.*

* cited by examiner

Primary Examiner—Gregory Mills
Assistant Examiner—P. Hassanzadeh
(74) Attorney, Agent, or Firm—Townsend and Townsend and Crew

(57) ABSTRACT

A sub-atmospheric chemical vapor deposition ("SACVD") system with a bypass from a dopant source to an exhaust system and related methods and devices. The flow of dopant may be established by dumping the dopant flow directly to the foreline of a vacuum exhaust system of an SACVD system, rather than flowing the dopant through the chamber. Establishing the dopant flow in this manner prior to the deposition of a silicon glass film on a substrate allows the initial portion of the silicon glass film to be doped at a higher level. Prior apparatus resulted in a dopant-deficient region of silicon glass formed before the dopant was fully flowing. In one embodiment, a doped silicon glass film is used as a dopant source for a semiconductor material, in another embodiment, a multi-layer doped silicon glass film achieves superior reflow.

3 Claims, 16 Drawing Sheets

SUB-ATMOSPHERIC CHEMICAL VAPOR DEPOSITION SYSTEM WITH DOPANT BYPASS

CROSS REFERENCE TO RELATED APPLICATIONS

This application is being filed on the same date as related Application Ser. No. 09/076,170 entitled "A TWO-STEP BOROPHOSPHOSILICATE GLASS DEPOSITION PROCESS AND RELATED DEVICES AND APPARATUS", the disclosure of which is hereby incorporated in its entirety for all purposes.

BACKGROUND OF THE INVENTION

The present invention relates generally to fabrication processes suitable for manufacturing semiconductor integrated circuits ("ICs"), and more particularly to a two-step borophosphosilicate glass ("BPSG") deposition process and related devices and apparatus.

The fabrication sequence of integrated circuits often includes several patterning processes. The patterning processes may define a layer of conductors, such as a patterned metal or polysilicon layer, or may define isolation structures, such as trenches. In many cases the trenches are filled with an insulating, or dielectric, material. This insulating material can serve several functions. The material serves to electrically isolate one region of the IC from another, and can also electrically passivate the surface of the trench. The material also typically provides a base for the next layer of the semiconductor to be built upon.

After patterning a substrate, that material is not flat. The topology of the pattern can interfere with or degrade subsequent wafer processing steps. It is often desirable to create a flat surface over the patterned material. Several methods have been developed to create such a flat, or "planarized", surface. Examples include depositing a conformnal layer of material of sufficient thickness and polishing the wafer to obtain a flat surface, depositing a conformal layer of material of sufficient thickness and etching the layer back to form a planarized surface, and forming a layer of relatively low-melting point material, such as BPSG, and then heating the wafer sufficiently to cause the BPSG to melt and flow as a liquid, resulting in a flat surface upon cooling. Each process has attributes that make that process desirable for a specific application.

Forming and then melting a layer of BPSG is a desirable layer-forming process for many reasons. The re-flow (melting) temperature of the BPSG is fairly low and the re-flow time is fairly brief, thus re-flow may be accomplished without significantly adding to the thermal budget of the device fabrication sequence. Additionally, BPSG may be doped to various doping concentrations to vary the re-flow characteristics. BPSG can flow to fill very fine features on the surface of a substrate, and can fill trenches of varying widths on a single substrate.

As semiconductor design has advanced, the feature size of the semiconductor devices has dramatically decreased. Many circuits now have features, such as traces or trenches less than a micron across. While the reduction in feature size has allowed higher device density, more chips per wafer, more complex circuits, lower operating power consumption, and lower cost, the smaller geometries have also given rise to new problems, or have resurrected problems that were once solved for larger geometries.

An example of the type of manufacturing challenge presented by sub-micron devices is the ability to completely fill a narrow trench in a void-free manner. To fill a trench with BPSG, a layer of BPSG is first deposited on the patterned substrate. The BPSG layer typically covers the field, as well as walls and bottom of the trench. If the trench is wide and shallow, it is relatively easy to completely fill the trench with BPSG. As the trench gets narrower and the aspect ratio (the ratio of the trench height to the trench width) increases, it becomes more likely that the opening of the trench will "pinch off".

Pinching off a trench traps a void within the trench. Under certain conditions, the void will be filled during the re-flow process; however, as the trench becomes narrower, it becomes more likely that the void will not be filled during the reflow process. Such voids are undesirable as they can reduce the yield of good chips per wafer and the reliability of the devices. Therefore, it is desirable to be able to fill narrow gaps with BPSG in a void-free manner. It is also desirable that the process used to deposit and reflow BPSG be efficient, reliable, and result in a high yield of devices.

SUMMARY OF THE INVENTION

The present invention provides apparatus and related methods and devices related to doped silicon glass layers. In one embodiment, dopant flow from a liquid precursor is established by diverting the flow directly to a vacuum system, bypassing a deposition chamber. Operation of a valve switches the dopant flow from the vacuum system to the deposition chamber concurrently with the flow of a deposition gas. The deposition gas, such as a silicon-containing gas, may be mixed with the dopant upstream from the valve such that a single valve operates to switch the silicon-containing gas and dopant. Flowing the dopant to the deposition chamber in this fashion forms a layer of doped silicon glass without a dopant-deficient region.

In one application, a two-step deposition process is used to efficiently form a two-layer doped silicon glass film without a dopant-deficient region between the layers using different deposition conditions to form each layer. In another application, a two-step deposition process forms a two-layer doped silicon glass film with different levels of selected dopant or types of dopant in each layer. In another application, a layer of silicon glass without a dopant-deficient region to be used as a dopant source is formed on a semiconductor. One embodiment of the invention is an intermediate IC structure that includes a doped silicon glass layer in contact with a silicon substrate as a source for dopant diffusion, wherein the doped silicon glass layer does not have a dopant-deficient region adjoining the silicon substrate.

These and other embodiments of the present invention, as well as some of its advantages and features are described in more detail in conjunction with the text below and attached figures.

BRIEF DESCRIPTION OF THE DRAWINGS

FIGS. 3A–3D are simplified cross sections of trenches on a substrate being filled with re-flowed doped silicon glass;

DESCRIPTION OF PREFERRED EMBODIMENTS

A two-step BPSG deposition process results in efficient void-free gap filling of narrow trenches, such as trenches as narrow as about 0.06 microns, with aspect ratios greater than 4:1. The two-step process produces a highly conformal film during the first step, and uses a high deposition rate during the second step, to achieve high throughput and good film stability. The two-layer film allows different doping concentrations during each step and improves the gap-filling, thickness uniformity, and film stability of the resulting film compared to a single-layer film. A bypass conduit from a doping gas source to the exhaust system allows transitioning between one deposition condition to another without a dopant depletion region being formed.

I. Exemplary Deposition System

Figure 1A:
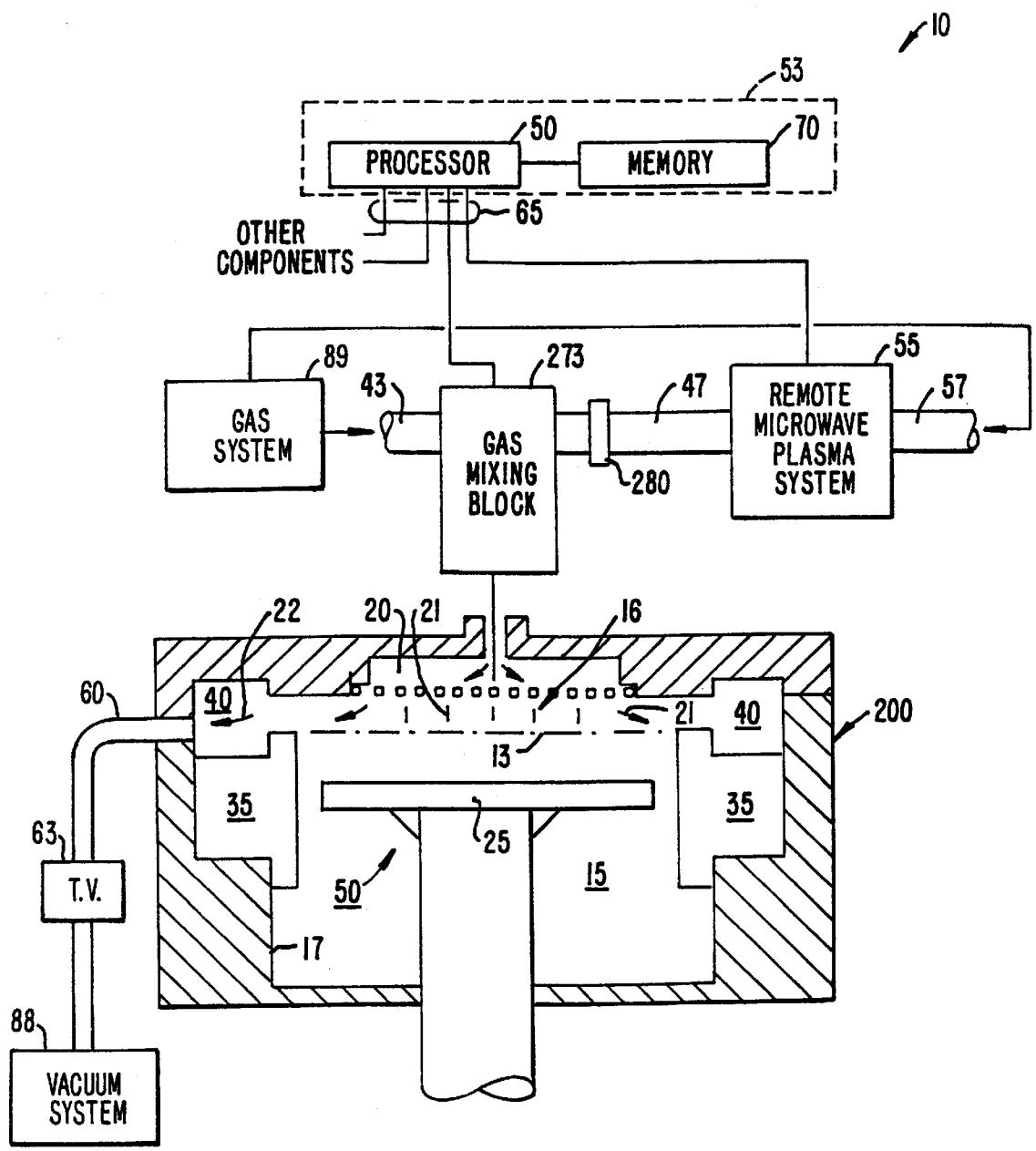
FIG. 1A is a simplified representation of a CVD apparatus according to the present invention.

FIG. 1A is a simplified diagram of a chemical vapor deposition ("CVD") system 10 according to the present invention. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 15 that receives process and other gases from a gas delivery system 89, a vacuum system 88, a remote microwave plasma system 55, and a control system 53. These and other components are described below in order to understand the present invention.

The CVD apparatus 10 includes an enclosure assembly 200 housing a vacuum chamber 15 with a gas reaction area 16. A gas distribution plate 20 is provided above the gas reaction area 16 for dispersing reactive gases and other gases, such as purge gases, through perforated holes in the gas distribution plate 20 to a wafer (not shown) that rests on a vertically movable heater 25 (also referred to as a wafer support pedestal). The heater 25 can be controllably moved between a lower position, where a wafer can be loaded or unloaded, for example, and a processing position closely adjacent to the gas distribution plate 20, indicated by a dashed line 13, or to other positions for other purposes, such as for an etch or cleaning process. A center board (not shown) includes sensors for providing information on the position of the wafer.

The heater 25 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 25 exposed to the vacuum chamber 15 are made of a ceramic material, such as aluminum oxide ($Al_2O_3$ or alumina) or aluminum nitride.

Reactive and carrier gases are supplied through the supply line 43 into a gas mixing box (also called a gas mixing block) 273, where they are preferably mixed together and delivered to the gas distribution plate 20. The gas mixing box 273 is preferably a dual input mixing block coupled to a process gas supply line 43 and to a cleaning/etch gas conduit 47. A valve 280 operates to admit or seal gas or plasma from the gas conduit 47 to the gas mixing block 273. The gas conduit 47 receives gases from an integral remote microwave plasma system 55, which has an inlet 57 for receiving input gases. During deposition processing, gas supplied to the plate 20 is vented toward the wafer surface (as indicated by arrows 21), where it may be uniformly distributed radially across the wafer surface, typically in a laminar flow.

Purging gas may be delivered into the vacuum chamber 15 from the plate 20 and/or an inlet port or tube (not shown) through the bottom wall of enclosure assembly 200. The purging gas flows upward from the inlet port past the heater 25 and to an annular pumping channel 40. An exhaust system then exhausts the gas (as indicated by arrows 22) into the annular pumping channel 40 and through an exhaust line 60 to a vacuum system 88, which includes a vacuum pump (not shown). Exhaust gases and entrained particles are drawn from the annular pumping channel 40 through the exhaust line 60 at a rate controlled by a throttle valve system 63.

The remote microwave plasma system 55 can produce a plasma for selected applications, such as chamber cleaning or etching native oxide or residue from a process wafer. Plasma species produced in the remote plasma system 55 from precursors supplied via the input line 57 are sent via the conduit 47 for dispersion through the plate 20 to the vacuum chamber 15. Precursor gases for a cleaning application may include fluorine, chlorine, and other reactive elements. The remote microwave plasma system 55 also may be adapted to deposit plasma-enhanced CVD films by selecting appropriate deposition precursor gases for use in the remote microwave plasma system 55.

The system controller 53 controls activities and operating parameters of the deposition system. The processor 50 executes system control software, such as a computer program stored in a memory 70 coupled to the processor 50. Preferably, the memory 70 may be a hard disk drive, but of course the memory 70 may be other kinds of memory, such as read-only memory or flash memory. In addition to a hard disk drive (e.g., memory 70), the CVD apparatus 10 in a preferred embodiment includes a floppy disk drive and a card rack (not shown).

The processor 50 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 50 to configure the CVD system 10 into various apparatus.

The processor 50 has a card rack (not shown) that contains a single-board computer, analog and digital input/output boards, interface boards and stepper motor controller boards. Various parts of the CVD system 10 conform to the Versa Modular European (VME) standard which defines board, card cage, and connector dimensions and types. The VME standard also defines the bus structure having a 16-bit data bus and 24-bit address bus.

Figure 1B:
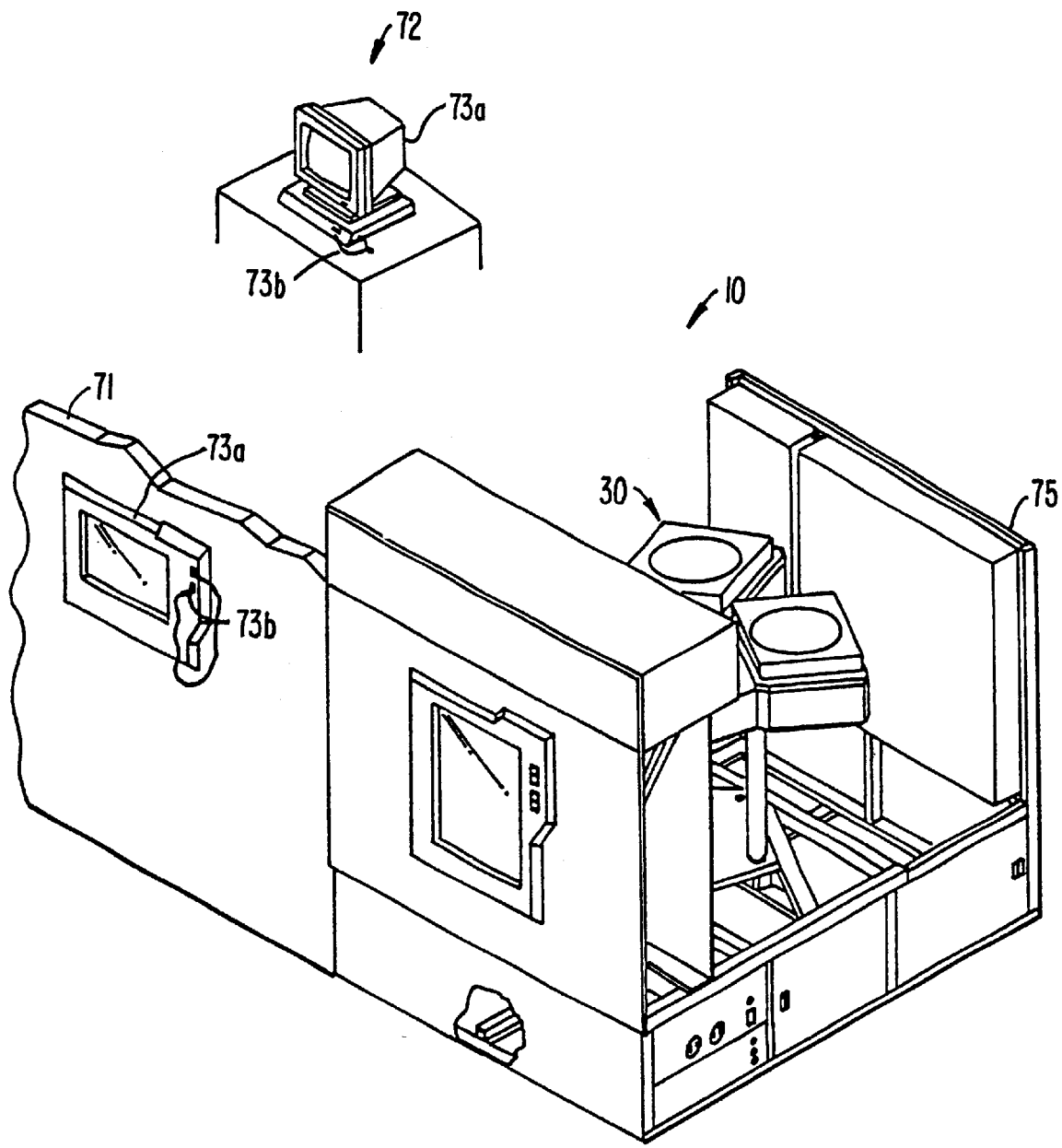
FIG. 1B is a simplified representation of the user interface for a CVD system in relation to a deposition chamber in a multi-chamber system.

FIG. 1B is a simplified diagram of a user interface in relation to the CVD apparatus chamber 30. The CVD apparatus 10 includes one chamber of a multichamber system. Wafers may be transferred from one chamber to another for additional processing. In some cases the wafers are transferred under vacuum or a selected gas. The interface between a user and the processor is via a CRT monitor 73a and a light pen 73b. A mainframe unit 75 provides electrical, plumbing, and other support functions for the CVD apparatus 10. Exemplary mainframe units compatible with the illustrative embodiment of the CVD apparatus are currently commercially available as the PRECISION 5000™ and the CENTURA 5200™ systems from APPLIED MATERIALS, INC. of Santa Clara, Calif.

In the preferred embodiment two monitors 73a are used, one mounted in the clean room wall 71 for the operators, and the other behind the wall 72 for the service technicians. Both monitors 73a simultaneously display the same information, but only one light pen 73b is enabled. The light pen 73b detects light emitted by the CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 73b to allow the user to communicate with the processor.

Figure 1C:
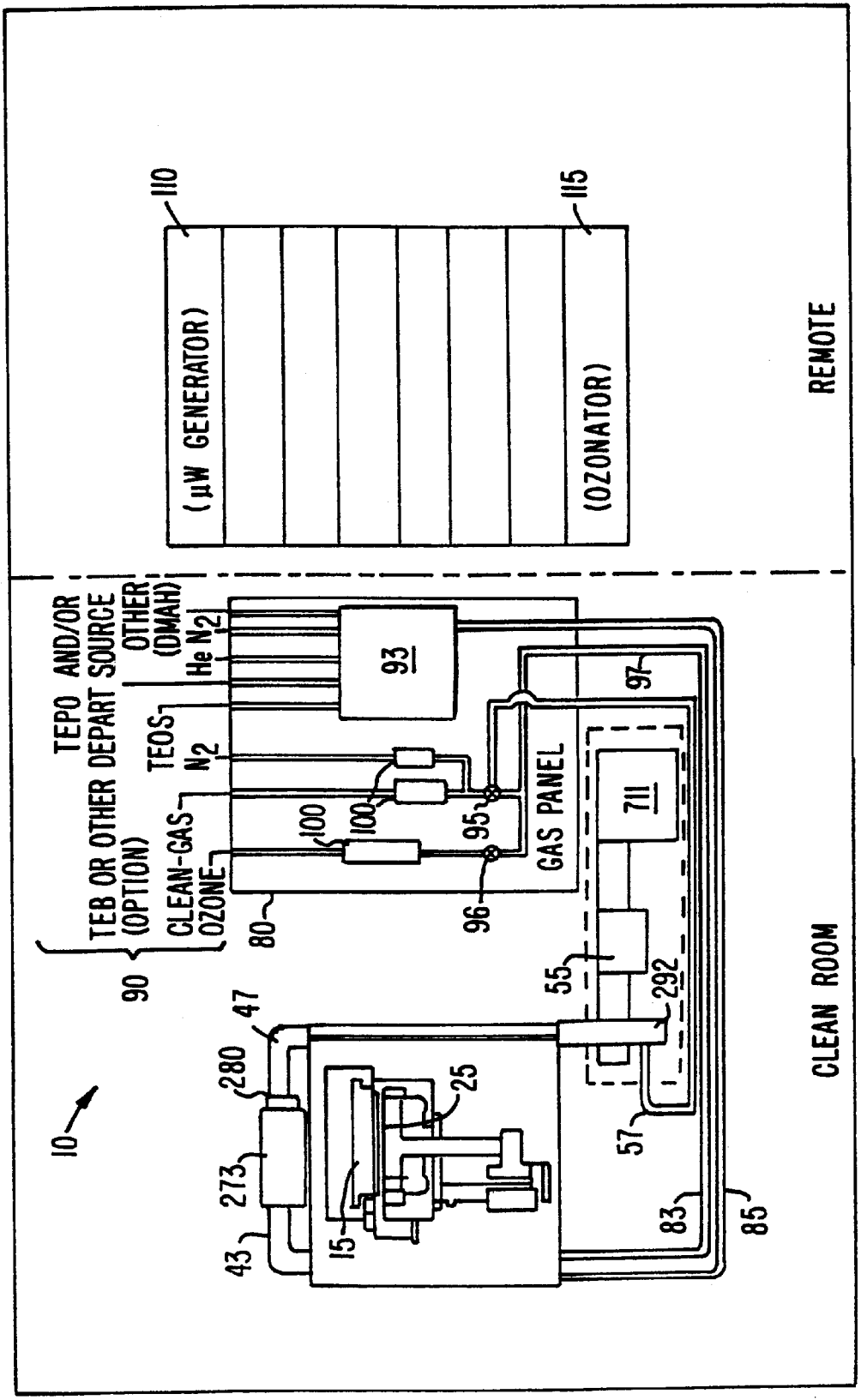
FIG. 1C is a simplified diagram of a gas panel and supply lines in relation to a deposition chamber.

FIG. 1C illustrates a general overview of the CVD apparatus 10 in relation to a gas supply panel 80 located in a clean room. As discussed above, the CVD system 10 includes a chamber 15 with a heater 25, a gas mixing box 273 with inputs from an inlet tube 43 and a conduit 47, and remote microwave plasma system 55 with input line 57. As mentioned above, the gas mixing box 273 is for mixing and injecting deposition gas(es) and clean gas(es) or other gas (es) through the inlet tube 43 to the processing chamber 15.

The remote microwave plasma system 55 is integrally located and mounted below the chamber 15 with the conduit 47 coming up alongside the chamber 15 to the gate valve 280 and the gas mixing box 273, located above the chamber 15. Supply lines 83 and 85 from the gas supply panel 80 provide reactive gases to the gas supply line 43. The gas supply panel 80 includes lines from gas or liquid sources 90 that provide the process gases for the selected application.

The gas supply panel 80 has a mixing system 93 that mixes selected gases before flow to the gas mixing box 273. In some embodiments, gas mixing system 93 includes a liquid injection system for vaporizing reactant liquids such as tetraethylorthosilane ("TEOS"), triethylborate ("TEB"), and triethylphosphate ("TEPO"). Vapor from the liquids is usually combined with a carrier gas, such as helium. Generally, supply lines for each of the process gases include (i) shut-off valves 95 that can be used to automatically or manually shut off the flow of process gas into line 85 or line 57, and (ii) mass flow controllers 100 or other types of controller that measure the flow of gas or liquid through the supply lines.

As an example, a mixture including TEPO as a phosphorus source, TEB as a boron source, and TEOS as a silicon source may be used with gas mixing system 93 in a deposition process for forming a BPSG film. The TEPO and TEOS are liquid sources that may be vaporized by conventional boiler-type or bubbler-type hot boxes; however, a liquid injection system is preferred as it provides greater control of the volume of reactant liquid introduced into the gas mixing system. The liquids are typically injected as a fine spray or mist into the carrier gas flow before being delivered to a heated gas delivery line 85 to the gas mixing block and chamber. One or more gaseous oxygen sources, such as oxygen ($O_2$) or ozone ($O_3$) flow to the chamber through another gas delivery line 83, to be combined with the reactant gases from heated gas delivery line 85 near or in the chamber. Of course, it is recognized that other sources of dopants, silicon, and oxygen also may be used.

Figure 1D:
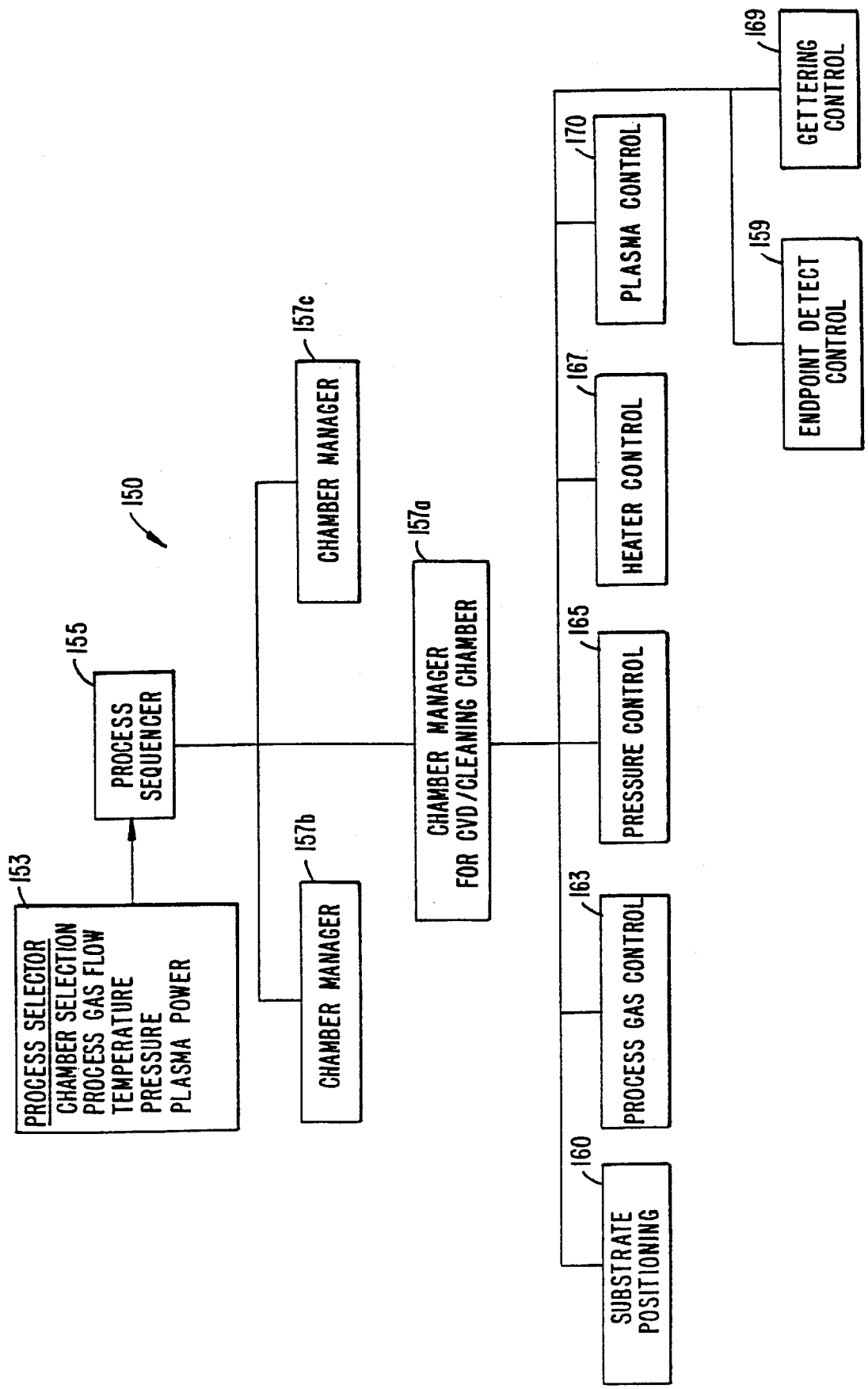
FIG. 1D is a simplified of a block diagram of the hierarchical control structure of the system control software according to a specific embodiment.

FIG. 1D is an illustrative block diagram of the hierarchical control structure of the system control software, computer program 150, according to a specific embodiment. A processes for depositing a film, performing a clean, or performing reflow or drive-in can be implemented using a computer program product that is executed by the processor 50. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled WINDOWS™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 153 by using the light pen to select a choice provided by menus or screens displayed on the CRT monitor. The process sets, which are predetermined sets of process parameters necessary to carry out specified processes, are identified by predefined set numbers. The process selector subroutine 153 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. The process selector subroutine 153 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 155 has program code for accepting the identified process chamber and process parameters from the process selector subroutine 153, and for controlling the operation of the various process chambers. Multiple users can enter process set numbers and process chamber numbers, or a single user can enter multiple process set numbers and process chamber numbers, so process sequencer subroutine 155 operates to schedule the selected processes in the desired sequence. Preferably, the process sequencer subroutine 155 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, the process sequencer subroutine 155 can be designed to take into consideration the present condition of the process chamber being used in comparison with the desired process conditions for a selected process, or the "age" of each particular user-entered request, or any other relevant factor a system programmer desires to include for determining scheduling priorities.

Once the process sequencer subroutine 155 determines which process chamber and process set combination is going to be executed next, the process sequencer subroutine 155 initiates execution of the process set by passing the particular process set parameters to a chamber manager subroutine 157a–c which controls multiple processing tasks in the process chamber according to the process set determined by the process sequencer subroutine 155. For example, the chamber manager subroutine 157a has program code for controlling CVD and cleaning process operations in the process chamber. The chamber manager subroutine 157 also controls execution of various chamber component subroutines which control operation of the chamber components necessary to carry out the selected process set. Examples of chamber component subroutines are substrate positioning subroutine 160, process gas control subroutine 163, pressure control subroutine 165, heater control subroutine 167, plasma control subroutine 170, endpoint detect control subroutine 159, and gettering control subroutine 169. Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber.

In operation, the chamber manager subroutine 157a selectively schedules or calls the process component subroutines in accordance with the particular process set being executed. The chamber manager subroutine 157a schedules the process component subroutines much like the process sequencer subroutine 155 schedules which process chamber and process set are to be executed next. Typically, the chamber manager subroutine 157a includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 1A and 1D. The substrate positioning subroutine 160 comprises program code for controlling chamber components that are used to load the substrate onto the heater 25 and, optionally, to lift the substrate to a desired height in the chamber to control the spacing between the substrate and the gas distribution manifold 20. When a substrate is loaded into the process chamber 15, the heater 25 is lowered to receive the substrate and then the heater 25 is raised to the desired height. In operation, the substrate positioning subroutine 160 controls movement of the heater 25 in response to process set parameters related to the support height that are transferred from the chamber manager subroutine 157a.

The process gas control subroutine 163 has program code for controlling process gas composition and flow rates. The process gas control subroutine 163 controls the state of safety shut-off valves, and also ramps the mass flow controllers up or down to obtain the desired gas flow rate. Typically, the process gas control subroutine 163 operates by opening the gas supply lines and repeatedly (i) reading the necessary mass flow controllers, (ii) comparing the readings to the desired flow rates received from the chamber manager subroutine 157a, and (iii) adjusting the flow rates of the gas supply lines as necessary. Furthermore, the process gas control subroutine 163 includes steps for monitoring the gas flow rates for unsafe rates, and activating the safety shut-off valves when an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, procss gas control subroutine 163 is programmed to include steps for flowing the inert gas into the chamber for an amount of time necessary to stabilize the pressure in the chamber, and then the steps described above would be carried out. Additionally, when a process gas is to be vaporized from a liquid precursor, such as TEOS, TEPO, or TEB, process gas control subroutine 163 would be written to include steps for bubbling a delivery gas such as helium through the liquid precursor in a bubbler assembly, or controlling a liquid injection system to spray or squirt liquid into a stream of carrier gas, such as helium. When a bubbler is used for this type of process, the process gas control subroutine 163 regulates the flow of the delivery gas, the pressure in the bubbler, and the bubbler temperature in order to obtain the desired process gas flow rates. As discussed above, the desired process gas flow rates are transferred to the process gas control subroutine 163 as process parameters.

Furthermore, the process gas control subroutine 163 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas floe rate, bubbler pressure and bubbler temperature are monitored, compared to the necessary values and adjusted accordingly.

The pressure control subroutine 16 comprises program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control su routine 165 is invoked, the desired or target pressure level is received as a parameter from the chamber manager subroutine 157a. The pressure control subroutine 165 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values.

Alternatively, the pressure control subroutine 165 can be written to open or close the throttle valve to a particular aperture size, i.e. a fixed position, to regulate the pressure in the chamber. Controlling the exhaust capacity in this way does not invoke the feedback control feature of the pressure control subroutine 165.

The heater control subroutine 167 comprises program code for controlling the current to a heating unit that is used to heat the substrate. The heater control subroutine 167 is also invoked by the chamber manager subroutine 157a and receives a target, or set-point, temperature parameter. The heater control subroutine 167 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. The heater control subroutine 167 includes the ability to gradually control a ramp up or down of the heater temperature. This feature helps to reduce thermal cracking in the ceramic heater. Additionally, a built-in fail-safe mode can be included to detect safety compliance, and can shut down operation of the heating unit if the process chamber is not properly set up.

II. Exemplary Structure

Figure 2:
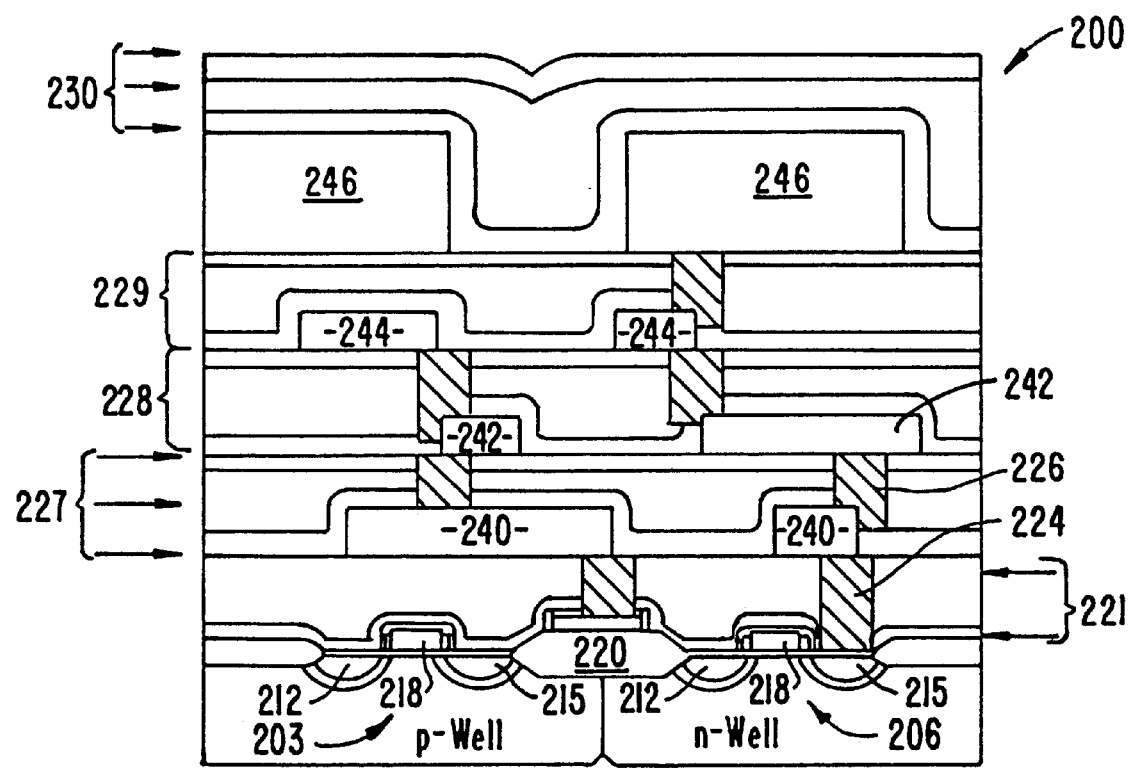
FIG. 2 is a simplified cross section of a portion of an integrated circuit according to the present invention.

FIG. 2 illustrates a simplified cross-sectional view of an integrated circuit 200 according to the present invention. As shown in FIG. 2, the integrated circuit 200 includes NMOS and PMOS transistors 203 and 206, which are separated and electrically isolated from each other by a field oxide region 220. Alternatively, trench isolation, including a trench in combination with a channel-stop diffusion, can be used to isolate devices, or a combination of isolation techniques may be used. Each of the transistors 203 and 206 comprises a source region 212, a gate region 215, and a drain region 218.

A premetal dielectric layer 221 separates the transistors 203 and 206 from the metal layer 240, with connections between metal layer 240 and the transistors made by contacts 224. The premetal dielectric layer 221 may be a BPSG layer formed by a method according to the present invention, for example, and may be a single layer or multiple layers. The metal layer 240 is one of four metal layers, 240, 242, 244, and 246, included in the integrated circuit 200. Each metal layer is separated from adjacent metal layers by intermetal dielectric layers 227, 228, and 229. Adjacent metal layers are connected at selected openings by vias 226. Planarized passivation layers 230 are deposited over the metal layer 246.

A BPSG layer according to the present invention may find uses in each of the dielectric layers shown in integrated circuit 200. A BPSG layer according to the present invention may also be used in damascene layers, which are included in some integrated circuits. In damascene layers, a blanket layer is deposited over a substrate, selectively etched through to the substrate, and then filled with metal and etched back or polished to form metal contacts 224. After the metal layer is deposited, a second blanket deposition is performed and selectively etched. The etched areas are then filled with metal and etched back or polished to form vias 226.

It should be understood that the simplified integrated circuit 200 is for illustrative purposes only. One of ordinary skill in the art could implement the present method for fabrication of other integrated circuits, such as microprocessors, application-specific integrated circuits (ASICs), memory devices, and the like.

III. An Exemplary Two-Step BPSG Process

BPSG may be utilized for various applications in the fabrication of ICs and other electronic devices or mechanical structures. Conventional methods use a single-step BPSG deposition process to form a layer of material on the surface of a substrate, and then re-flow the BPSG layer by heating it using a rapid thermal pulse ("RTP") method or a conventional furnace, for example. The characteristics of both the BPSG deposition process (e.g. rate of deposition, conformation to the surface, uniformity across the wafer) and the resulting BPSG layer (e.g. melting point, film stress, shrinkage, chemical stability, water absorption) depend on many parameters. Until recently, a single set of deposition parameters would produce a BPSG layer that could be deposited efficiently (i.e. economically) and that would work well in IC applications.

Figure 3A:
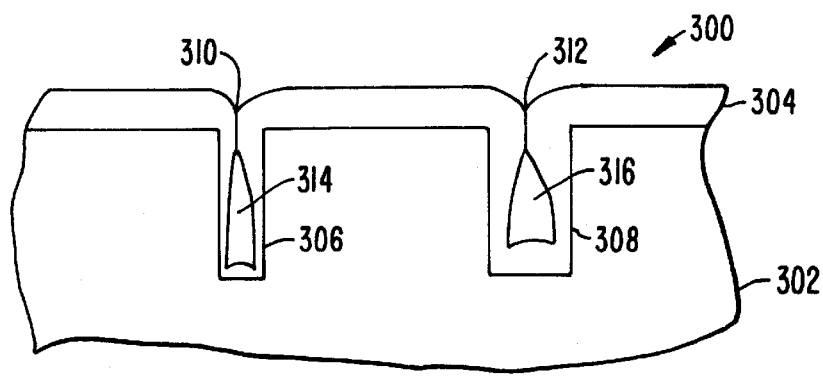
Figure 3B:
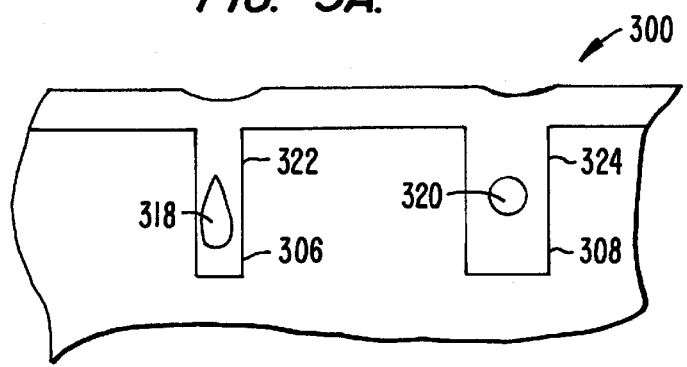
Figure 3C:
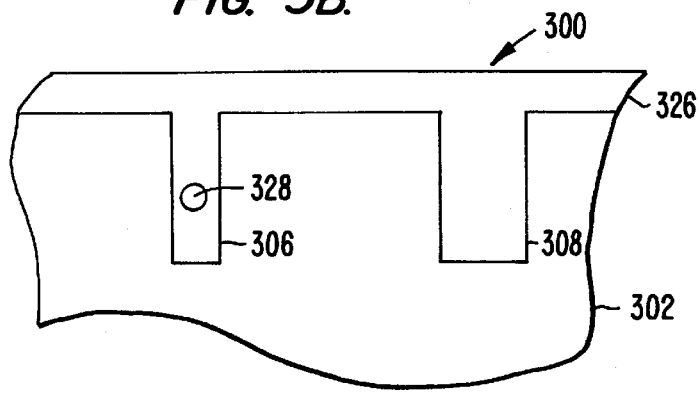

FIGS. 3A–3C are simplified cross sections of a portion of an IC 300 illustrating a limitation of conventional single-step BPSG deposition process. FIG. 3A shows a substrate 302 after a layer of BPSG 304 has been deposited. A narrow trench 306 and a wide trench 308 have been formed in the substrate 302 prior to the BPSG deposition. The layer of BPSG 304 partially fills each trench, but has been pinched off 310, 312 during the deposition process, leaving behind voids 314, 316.

FIG. 3B is a simplified cross section of the portion of the IC 300 after a re-flow process has begun. The deposition process was performed below atmospheric pressure, so the voids 318, 320 are evacuated. The re-flow process is typically done at atmospheric pressure, so as the BPSG layer melts and flows, material from the walls 322, 324 of the trenches 306, 308 are drawn into the voids by the vacuum.

FIG. 3C is a simplified cross section of the portion of the IC 300 after the re-flow process has been completed. The BPSG layer 326 has completely filled the wide trench 308, but a void 328 has formed in the narrow trench 306. It is believed that the void remained in the narrow trench because there was insufficient material on the walls of the trench to completely fill the void.

Figure 4:
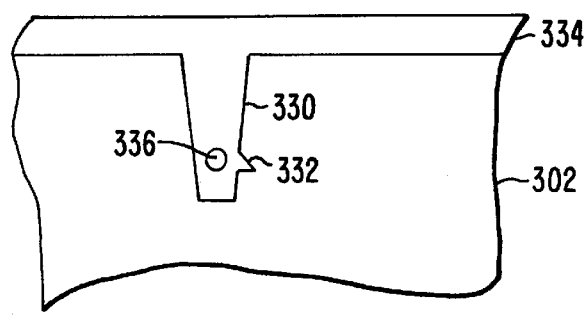
FIG. 4 is a simplified cross section of a trench with a negative profile and a resulting void.

FIG. 4 is a simplified cross section of a substrate 302 with a trench 330 with a negative profile 332. A layer of BPSG 334 has been formed over the substrate and re-flowed. A void 336 has formed adjacent to the negative profile 332, which is typical if there is a negative profile in the trench wall. The negative profile is a artifact of the trench-forming process. Conventional etch processes used to form trenches can reliably produce trench walls without negative profiles if the trench is sufficiently wide or shallow. However, as the trench widths have shrunk and the aspect ratios of the trenches have increased, the incidence of negative profiles and resulting voids has increased It was thought that depositing a more conformal layer, that is, a layer that provided more material on the walls of the trench before pinching off, would result in a void-free BPSG process, and might even be able to compensate for etch water from the atmosphere upon exposure. In some instances the film will crystallize or undergo phase separation from the solid solution. These and other defects may be detected during wafer inspection as particle adders. Unstable or recrystallized films typically result in a rejected wafer.

TABLE 1

Experimental results of designed experiment for evaluating BPSG film characteristics resulting from variations in selected process parameters.

| Rank | Dep. Rate | Uniformity | WERR | Stress | Shrinkage | WERR (annealed) | Conformity |
|---|---|---|---|---|---|---|---|
| 1 | TEOS (high) | T (low) | T (high) | T (high) | T (high) | $P*O_3\%$ (high) | P (high) |
| 2 | P (low) | TEOS (low) | TEOS (low) | TEOS (low) | TEOS (low) | T (low) | TEOS (low) |
| 3 | $O_3$ (low) | $O_3\%$ (high) | $O_3$ (high) | $O_3$ (high) | $O_3$ (high) | TEOS (low) | $O_3\%$ (high) |
| 4 | $P*O_3\%$ (low) | $O_3$ (high) | P (high) | $O_3\%$ (high) | P (high) | $P*O_3$ (low) | $P*O_3$ (low) |
| 5 | $P*T$ (high) | P (low) | $O_3\%$ (high) | P (high) | $O_3\%$ (high) | $P*T$ (low), $T*O_3$ (high) | $T*O_3\%$ (low) |
| 6 | $O_3\%$ (low) | $TEOS*O_3\%$ (high) | $T*O_3\%$ (low) | $T*TEOS$ (high) | $T*TEOS$ (high) | — | $TEOS*O_3\%$ (low) | processes that resulted in negative profiles. An experiment was designed to determine which of the several process variables had the most significant effect on film conformity, in the hope that a single-step deposition process could be developed. Several other film characteristics were also evaluated, to ensure that improving the conformation of a layer did not compromise other film characteristics and result in an unmanufacturable or unreliable film.

Sixteen wafers were produced, each having been fabricated with a BPSG deposition process in which five different process parameters were varied in a matrix fashion from a high value to a low value between wafers. The high value and the low value for each parameter was within the acceptable range for the BPSG deposition process. The resulting film characteristics of each wafer were then measured, and the sensitivity of each film characteristic to each process parameter was determined. The process parameters were then ranked for each film characteristic.

Out of the several process parameters and process variations to choose from, the five that were chosen to be varied were: process temperature, chamber pressure, TEOS flow rate, ozone flow rate, and ozone concentration. It was decided to use constant doping levels and doping ratios for each wafer. The wafers were 200 mm silicon wafers. The temperature was selected to be either 450° C. or 600° C., the pressure was selected to be either 150T or 700T, the TEOS flow rate was selected to be either 500 mgm or 1000 mgm, the ozone flow rate was selected to be either 2500 sccm or 5000 sccm, and the ozone concentration was either 6 wt % or 12.5 wt %. The film characteristics that were evaluated were: deposition rate, thickness uniformity across the wafer, film stress, shrinkage, film conformity, and the wet etch rate ratio ("WERR") both as-deposited and after re-flow/anneal.

Figure 5:
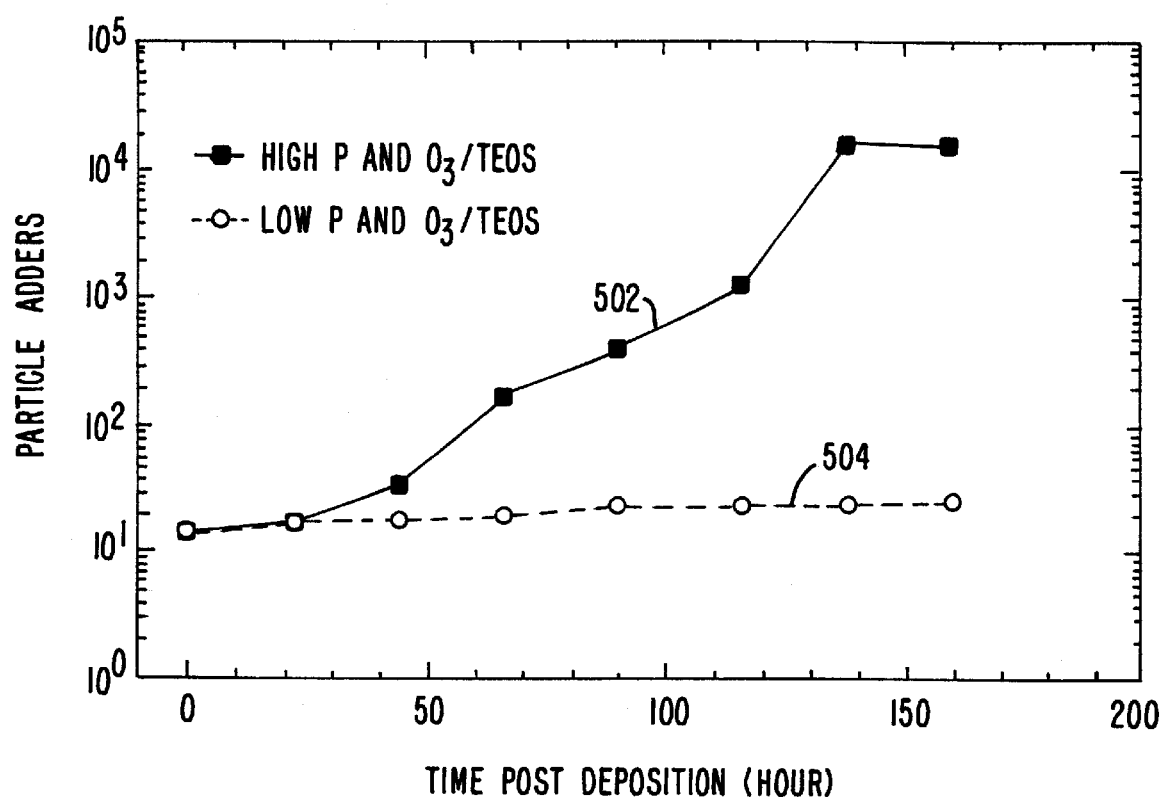
FIG. 5 is a graph illustrating particle adders versus time after deposition for BPSG films deposited under different conditions.

The results of the designed experiment are summarized in Table 1. At least two conclusions were based on these results. First, higher pressure and higher ozone:TEOS ratios will improve film conformity; however, this reduces the deposition rate, potentially to an undesirably low level. Second, the results suggested that a two-step deposition process might be developed to deposit sufficient material on the walls of a trench to result in a void-free filling process, and provide acceptable process times by achieving a low total deposition time. It was also noted that film stability was better after a low-pressure deposition process. A film is said to be unstable if the film absorbs appreciable amounts of FIG. 5 is a log-log graph of particle adders versus time for a BPSG film formed by a high-pressure, high ozone:TEOS ratio process 502, and a BPSG film formed by a low-pressure, low ozone:TEOS ratio process 504. The particle adders were measured using standard wafer inspection methods. Thus, a BPSG film 5 made by a single high-pressure, high ozone:TEOS ratio deposition step would not only take a long time to deposit, but would also result in a higher defect rate.

Figure 6A:
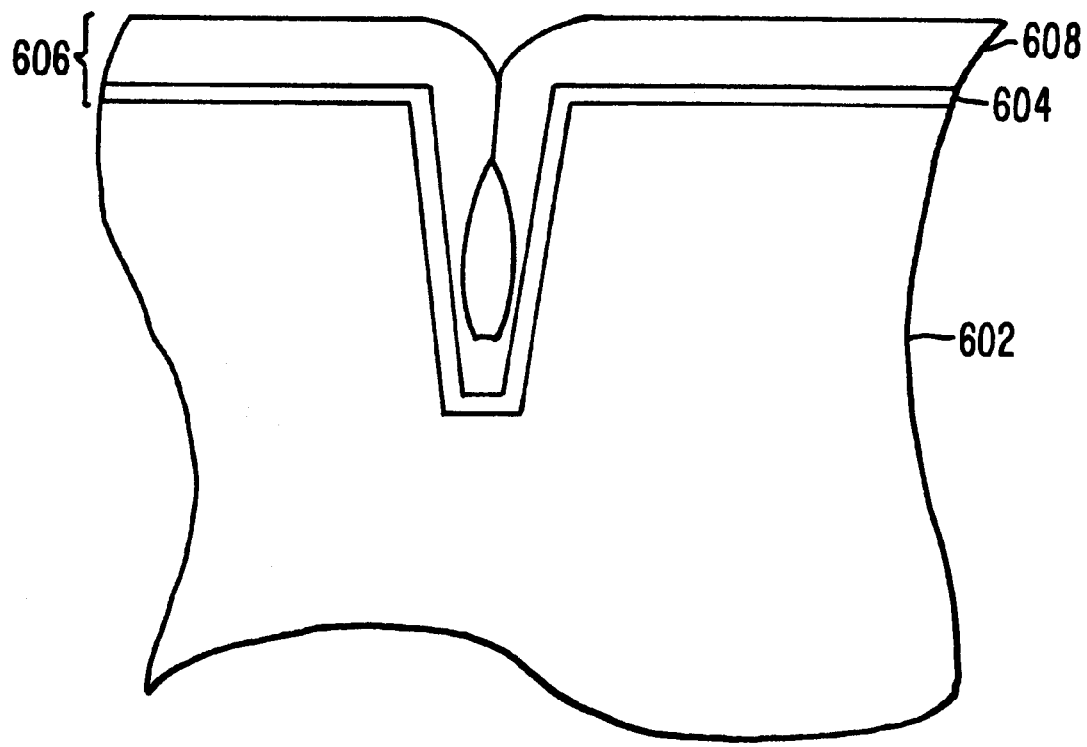
FIGS. 6A and 6B are simplified cross sections of a trench on a substrate being filled in a gap-free manner with BPSG layer according to an embodiment of the present invention.

FIG. 6A is a simplified cross section of a substrate 602 after a two-step BPSG deposition process. A highly conformal first portion 604 of a BPSG layer 606 was deposited prior to a high deposition rate second portion 608 of the BPSG layer. The first portion 604 is between about 600–700 Å thick and the second portion 608 is about 9,000 Å thick. The highly conformal layer was formed at a pressure of about 700T, an ozone:TEOS ratio of about 14.3:1 at a TEOS flow rate of about 300 mgm. The high deposition rate layer was formed at a pressure of about 150T, an ozone:TEOS ratio of about 5.4:1 at a TEOS flow rate of about 800 mgm. Both portions of the layer were formed at a substrate temperature of between about 480–600° C. Under these conditions, the first portion was formed in about 60 seconds, and the second portion was formed in about 90 seconds. The high deposition rate layer protects the highly conformal layer from exposure to the atmosphere after wafer processing, thus reducing particle adders, as discussed above in conjunction with FIG. 5.

Figure 6B:
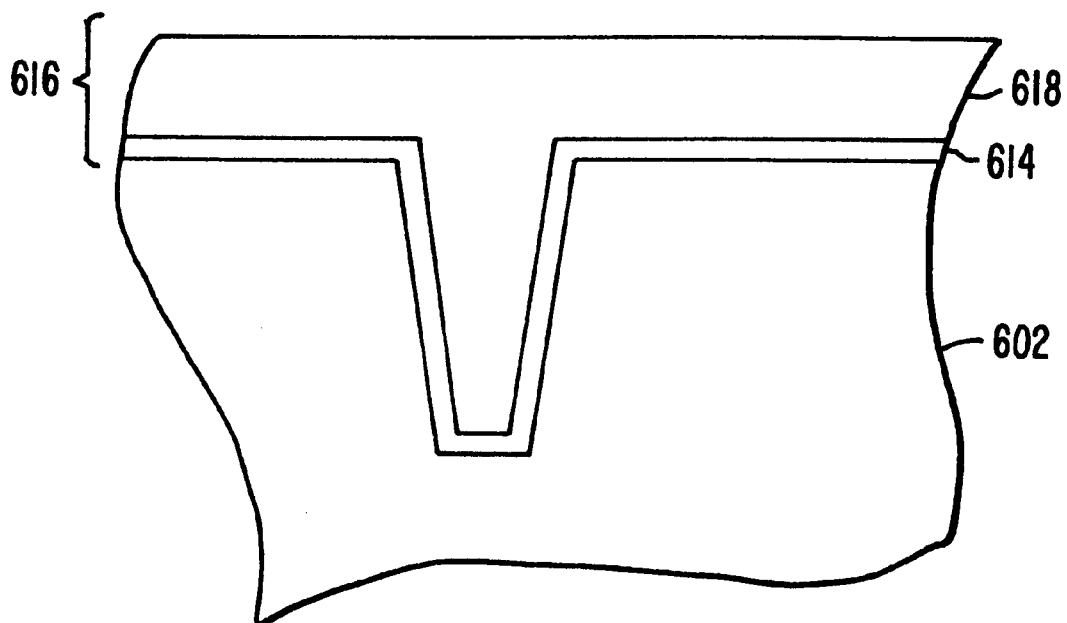

FIG. 6B is a simplified cross section of a substrate 602 after the two-step BPSG deposition process and re-flow. A first portion 614 of a BPSG film 616 was deposited using a deposition recipe that enhanced conformation. A second portion 618 of the BPSG film was deposited using a deposition recipe that enhanced 25 deposition rate and film stability (reduced particle adders). The post-anneal (post-reflow) WERR of the first portion 614 of the BPSG film 616 is higher than the WERR of the second portion 618 of the BPSG film 616.

Figure 7A:
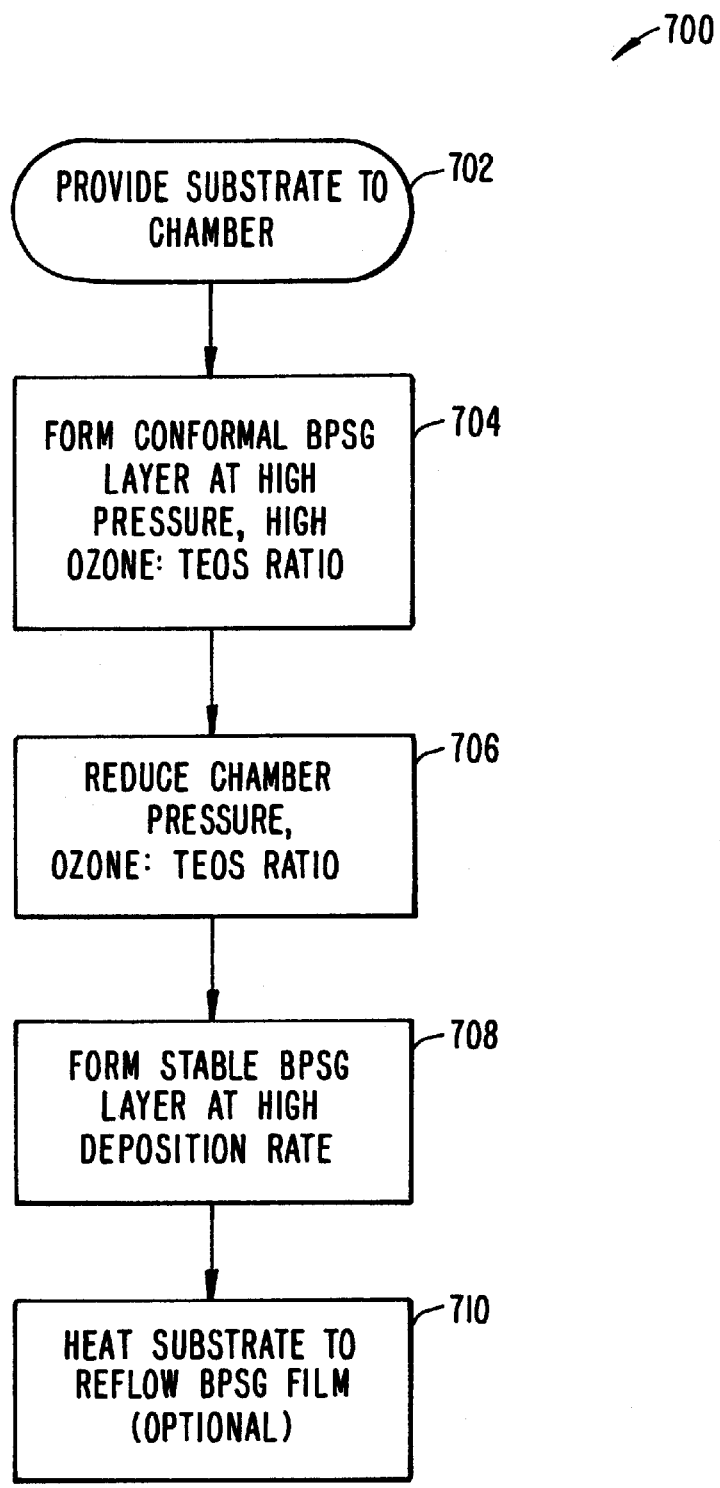
FIGS. 7A and 7B are flow charts of exemplary two-step BPSG deposition processes according to embodiments of the present invention.

FIG. 7A is a simplified flow chart of a two-step deposition process 700 for forming a BPSG layer. A substrate is provided (step 702) and a first portion of a 30 BPSG film is formed at a relatively high pressure and relatively high ozone:TEOS ratio (step 704) on the substrate. The chamber pressure and ozone:TEOS ratio are lowered (step 706), and a second portion of the BPSG film is formed over the first portion (step 708). After depositing the BPSG film, the BPSG film may be optionally re-flowed (step 710).

Figure 7B:
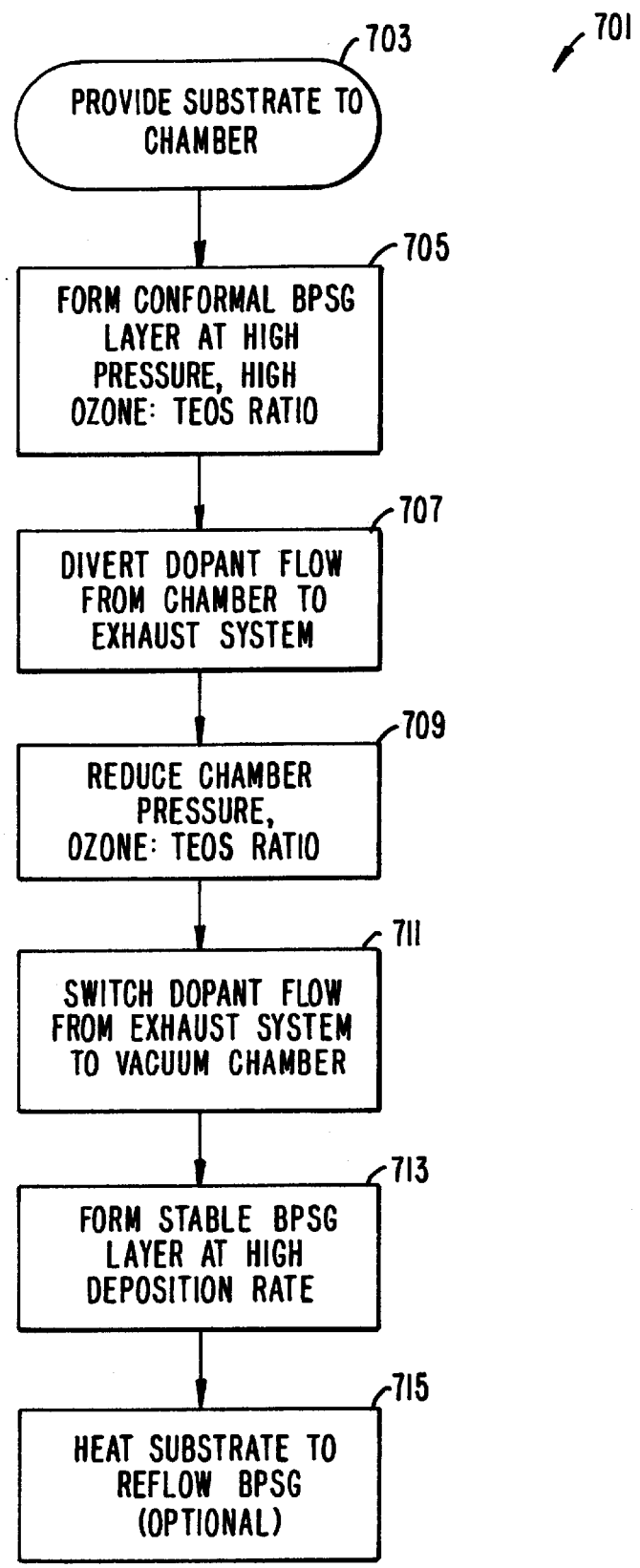

FIG. 7B is a simplified flow chart of a two-step deposition process 701 for forming a BPSG layer using a dopant bypass, is discussed below in conjunction with FIG. 9. A substrate is provided (step 703) and a first portion of a BPSG film is formed at a relatively high pressure and relatively high ozone:TEOS ratio (step 705). At least a portion of the dopant flow is switched to a bypass (step 707) so that the dopant flow is stable as the chamber pressure is lowered in conjunction with increasing the flow of TEOS relative to the flow of ozone (step 709). When the desired pressure has been reached (which may or may not be the deposition pressure) the portion of the dopant flow is switched from the bypass to the vacuum chamber (step 711), and a second portion of the BPSG film is formed over the first portion (step 713). After depositing the BPSG film, the BPSG film may be optionally re-flowed (step 715). It is noted that in FIG. 9, the deposition gas such as silicon-containing gas 911 is mixed with the dopant upstream from the valve such that a single valve 914 operates to switch the silicon-containing gas and dopant between the vacuum chamber 15 and the bypass line 902. In that case, both the silicon-containing gas flow and the dopant flow will be diverted, in step 707 and will be switched in step 711.

Figure 8:
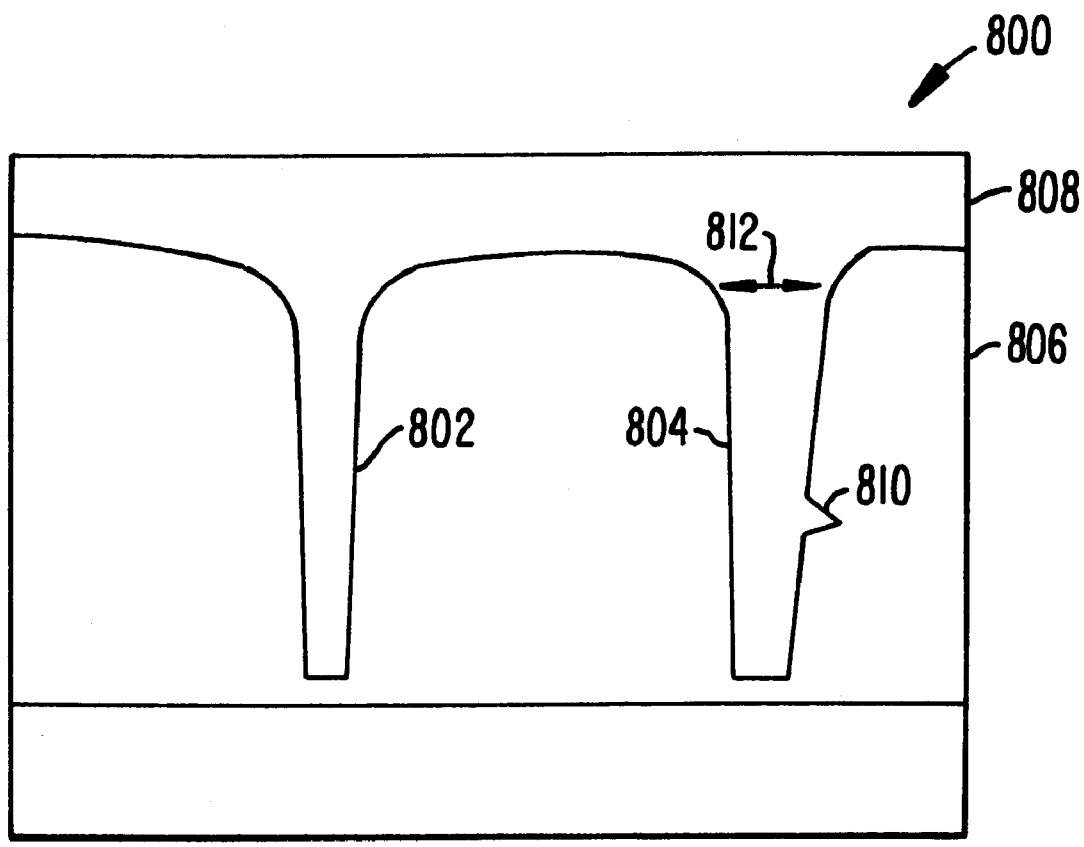
FIG. 8 is a tracing of a scanning electron micrograph of a portion of a substrate with a 0.06 micron trench having a negative profile that was filled without a void according to a process of the present invention.

FIG. 8 is a line tracing of a scanning electron micrograph ("SEM") of a portion of a substrate 800. Trenches 802, 804 were formed in a silicon wafer 806, and filled with a layer of BPSG 808. During the formation of one of the trenches 804, a negative profile 810 was inadvertently created. The BPSG layer 808 was deposited according to a two-step deposition process as described above and illustrated in FIG. 7A, and, after re-flow, completely filled the trenches in a void-free manner. No void remained adjacent to the negative profile 810, as would otherwise have been expected. The width 812 of the trench 804 is approximately 0.06 microns, and the aspect ratio of the trench is about 5.5:1 (i.e. the trench is approximately 0.33 microns deep). It is believed that the negative profile 810 resulted from attempting to etch a trench with such a narrow width and high aspect ratio.

IV. Dopant Bypass

It was discovered that depositing a two-layer BPSG film at different deposition conditions is not a matter of simply changing the conditions. A smooth transition between the first deposition conditions and the second deposition conditions is important to ensure a film with the desired properties, and especially to maintain the re-flow characteristics of the film. The re-flow characteristics of a BPSG layer depend on the dopant concentration, a higher dopant concentration typically resulting in better re-flow characteristics, such as a lower melting point and greater fluidity. A particular problem arose in maintaining the relative phosphorous dopant concentration as the TEOS flow rate was changed.

TEPO tends to decompose at typical BPSG deposition temperatures. Therefore, the traditional way to start the TEPO flow is to start flowing carrier gas through the liquid bubbler or other delivery system only after deposition has begun. However, it typically takes about 10 seconds to establish a stable flow of TEPO. A dopant-deficient interface layer results. A dopant-deficient interface layer adjoining the substrate does not create a re-flow problem, as the overlying BPSG will not be dopant deficient, and will re-flow properly. However, a dopant deficient layer in the middle of the BPSG layer reduces re-flow, and hence the ability to fill voids.

Figure 9:
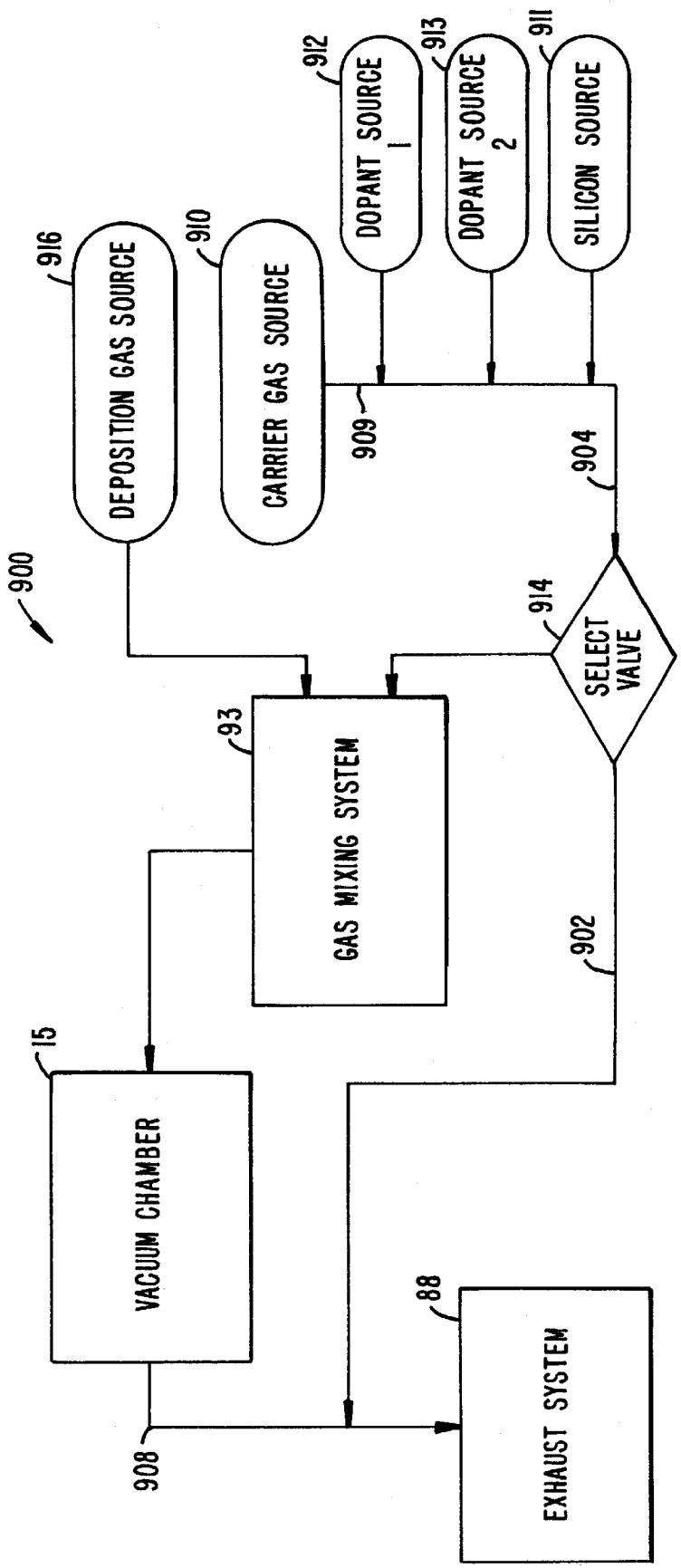
FIG. 9 is a simplified diagram of a CVD apparatus with a dopant bypass according to an embodiment of the present invention.

FIG. 9 is a simplified diagram of a CVD deposition apparatus 900 with a bypass 902 for depositing BPSG layers without the dopant deficient region that would arise from using a conventional system. While the apparatus may be used to deposit multi-layer BPSG films, it may also be beneficially applied to single-layer doped silicon glass films or other doped silicon glass films, such as phosphosilicate glass ("PSG"), borosilicate glass ("BSG"), arsenic-silicon glass ("AsSG"), or similar films. The bypass shunts dopant and silicon-containing gas, such as TEOS vapor, from the dopant supply line 904 to the vacuum system 88 foreline 908, thus circumventing the vacuum chamber 15, allowing the dopant flow to stabilize prior to routing the dopant and silicon-containing gas to the vacuum chamber.

Carrier gas, such as helium, from a carrier gas source 910 is combined with a silicon-source gas, such as TEOS vapor, from a silicon source 911 and dopant, such as TEPO vapor and/or TEB vapor, from the dopant sources 912, 913, and a desired flow rate is established while some or all of the gas flow maybe dumped directly into the vacuum system 88. The TEOS, TEB, and TEPO are injected from liquid sources into a carrier gas line 909. A valve 914 selects the output for the dopant, and the valve may be switched at the appropriate time to change the output from the vacuum system 88 to the vacuum chamber 15.

Figure 10:
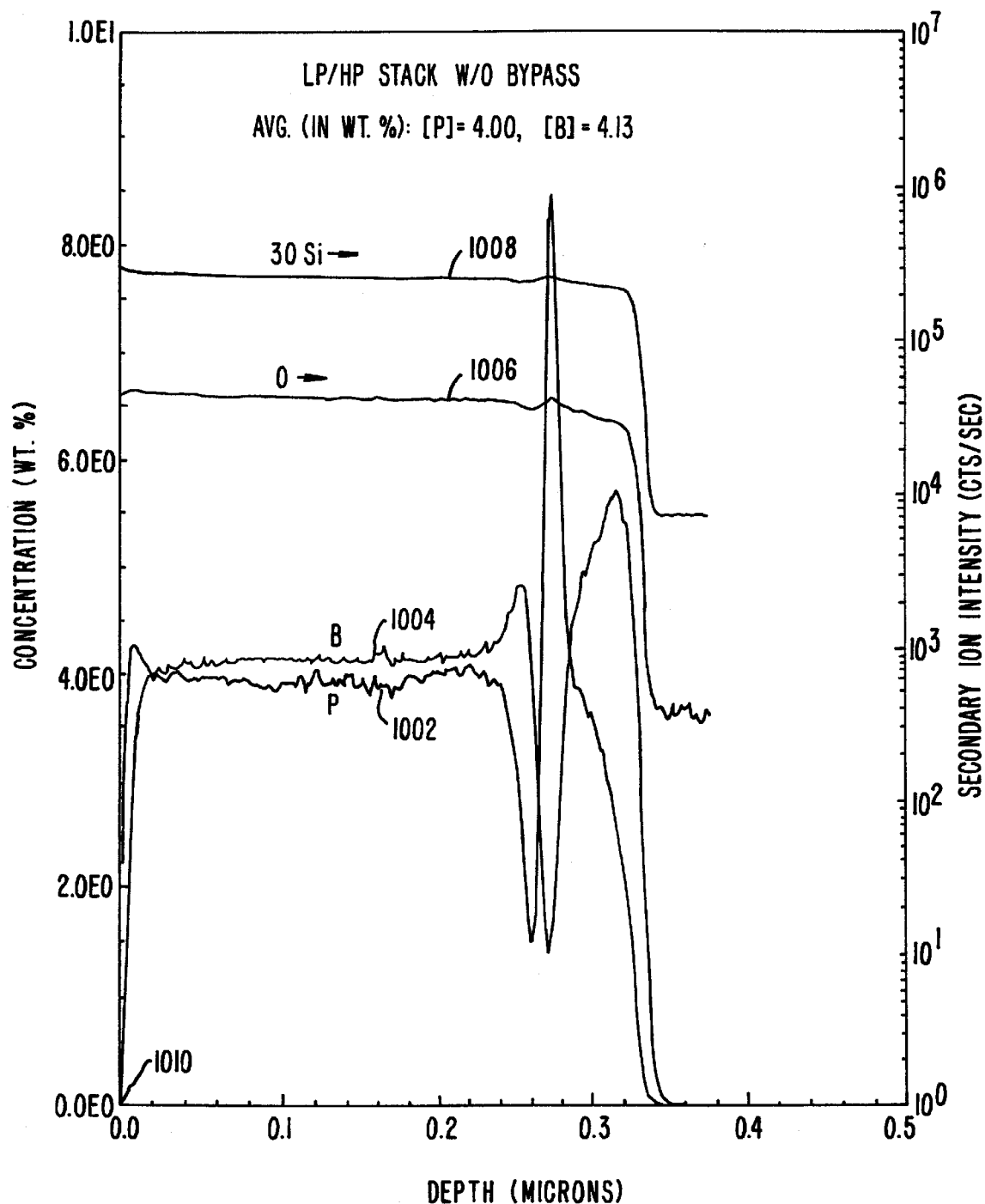
FIGS. 10 and 11 are graphs of elemental concentration versus depth of a BPSG layer formed from a two-step deposition process, with and without using a dopant bypass.
Figure 11:
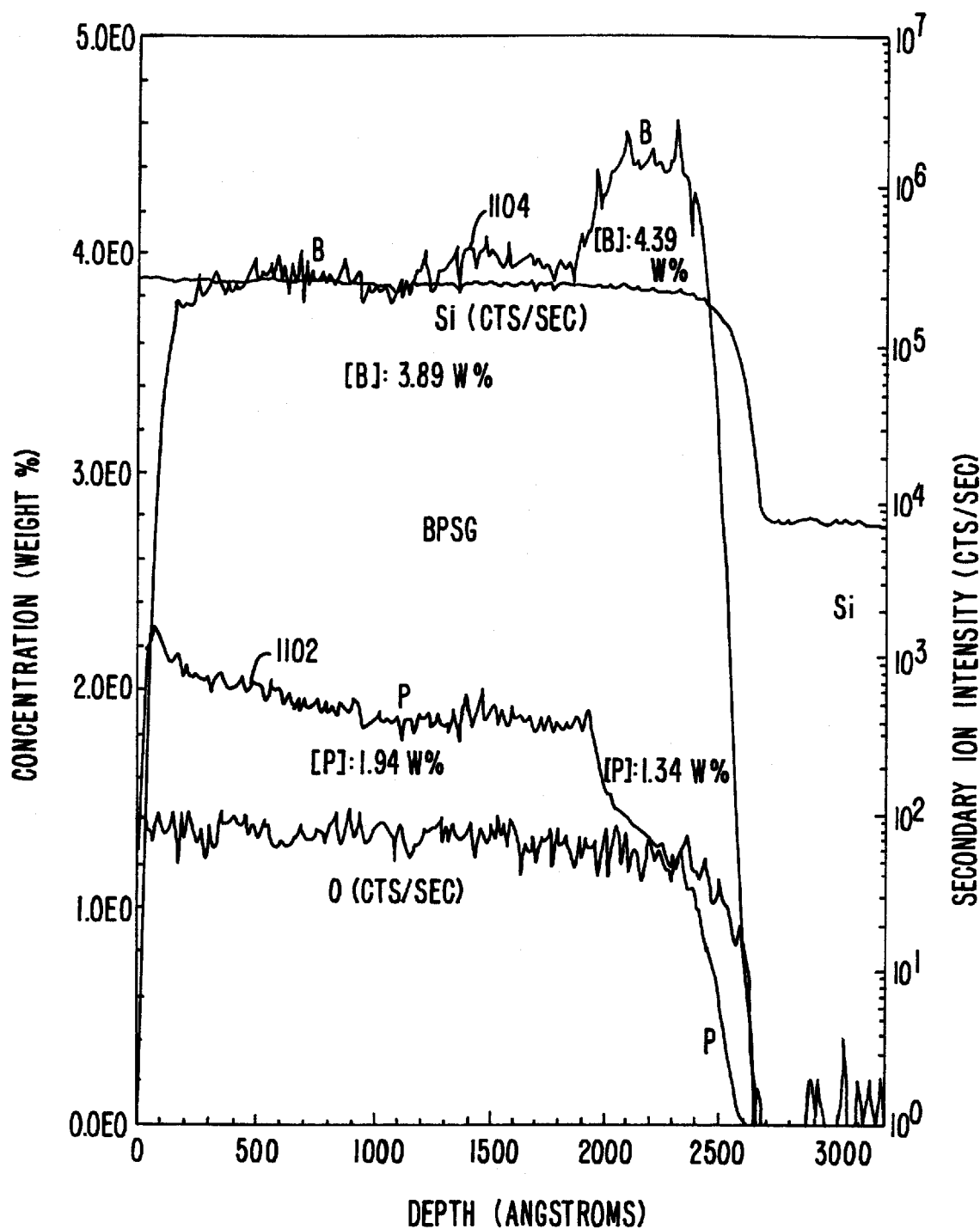

FIGS. 10 and 11 are elemental analysis versus depth of multi-layer BPSG films deposited with and without using a dopant bypass technique. FIG. 10 shows the concentration, in wt %, of phosphorous ("P") 1002, boron ("B") 1004, oxygen ("O") 1006, and silicon "(Si") 1008 versus depth from the surface (zero depth) 1010 of a wafer on which a two-step BPSG layer was formed in a CVD system without using a dopant bypass. The phosphorous concentration varies considerably at a depth of about 2.8 microns, forming a dopant-deficient region about a half a micron thick. The variation in dopant concentration indicates that the dopant flow was not stable when the transition was made from a high-pressure deposition (that formed the layer deeper than about 3.4 microns) to a low-pressure deposition (that formed the layer less than about 3.4 microns deep). This dopant deficient region impedes re-flow by creating a higher melting point, lower viscosity region within the BPSG film.

FIG. 11 shows the concentration of the same elements versus depth for a similar wafer on which a BPSG layer was formed by a two-step process utilizing a dopant bypass technique. The y-axis of this graph has an expanded scale of half the range shown in FIG. 10. Hence, variations in the doping level are more readily apparent in FIG. 11 than in FIG. 10. The phosphorous concentration 1102 and boron concentration 1104 do not oscillate, as in the prior layer illustrated in FIG. 10, thus avoiding the formation of a dopant-deficient region. In this instance, the transition between the low-pressure portion of the film and the high-pressure portion of the film occurs at a depth of about 2–2.5 microns.

The total amount of gas flowing into the chamber remained approximately constant for both periods, the difference in TEOS, dopant, and carrier flow that bypassed the chamber being made up by a non-deposition gas flow, such as argon or nitrogen. The chamber pressure was changed from the selected high-pressure value to the selected low-pressure value by opening the throttle valve between the foreline and the chamber, as described above in conjunction with FIGS. 1A–1D. The dopant and associated carrier gas were abruptly switched from the exhaust system to the chamber during the transition between the high-pressure and low-pressure depositions; however, the valve 914, FIG. 9, could be a proportional valve that allowed a gradual, or ramped, diversion of dopant from one output to the next.

Introducing dopant to the deposition chamber after establishing the dopant flow using a bypass to the exhaust system not only results in a layer without a dopant deficient region, but also allows the deposition to be completed in less time, as the 10 or so seconds that are typically required to stabilize the dopant flow during a conventional deposition are not needed.

Figure 12:
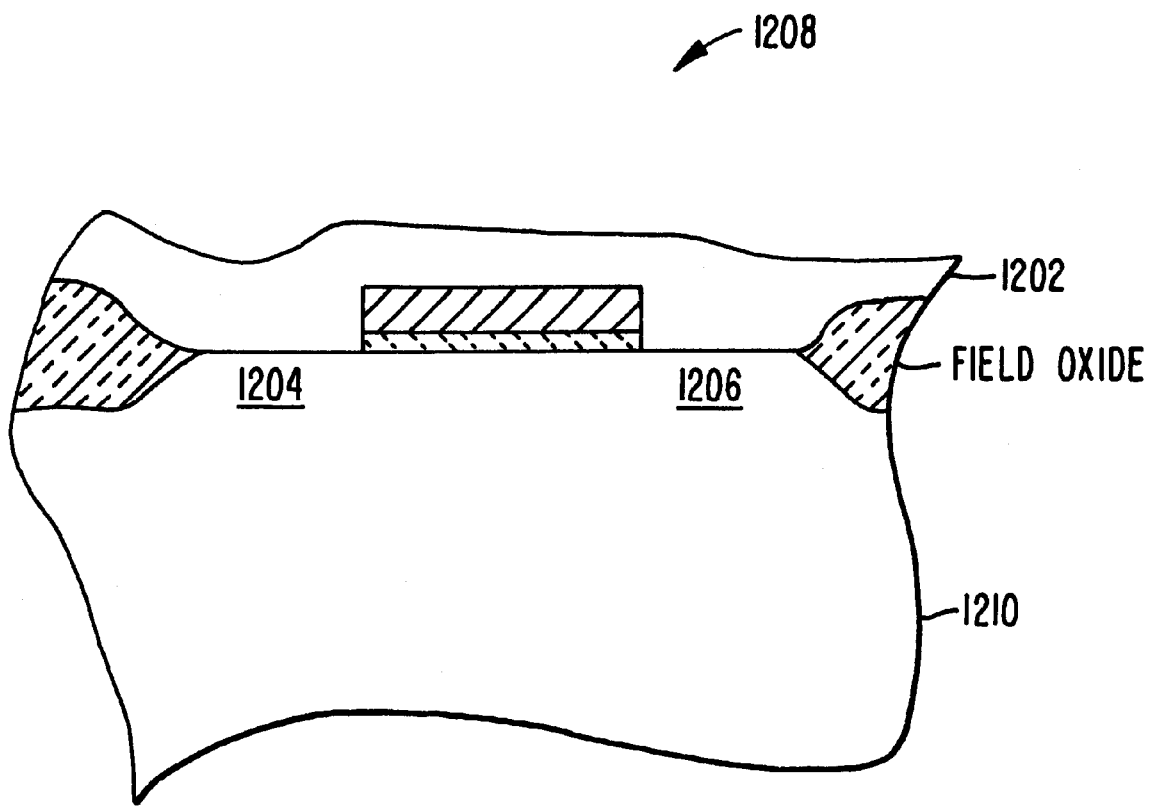
FIG. 12 is a simplified cross section of a portion of an integrated circuit having a layer of doped silicon glass without a dopant-deficient region adjacent to a silicon substrate, according to another embodiment of the present invention.

The dopant bypass may also be used for single-layer doped silicon glass processes. FIG. 12 shows a portion of an IC in which a layer of BSG 1202 has been formed over portions 1204, 1206 of an active circuit region 1208 in a substrate 1210. This active circuit region may eventually become a field effect transistor ("FET"), for example, the portions 1204, 1206 being drain and source regions. The BSG layer provides boron, a p-type dopant, to the underlying silicon substrate 1210, which may be an epitaxial layer on a bulk silicon wafer, for example. After the BSG layer has been formed, the boron is driven into the silicon in a heat treatment process. Conventional methods result in a BSG layer with a dopant-deficient region nearest the silicon substrate, as discussed above. The reduced concentration of dopant in this region limits the amount of dopant available for diffusing into the silicon. It is generally desirable to provide a high amount of dopant. Using a bypass to establish dopant flow prior to the beginning of the deposition allows dopant to be incorporated into the initial glass layer at a desirably higher concentration. The bypass also allows the dopant flow to be reduced as the layer is formed, so that the final portion of the layer may have a reduced dopant concentration that improves film stability.

Figure 13:
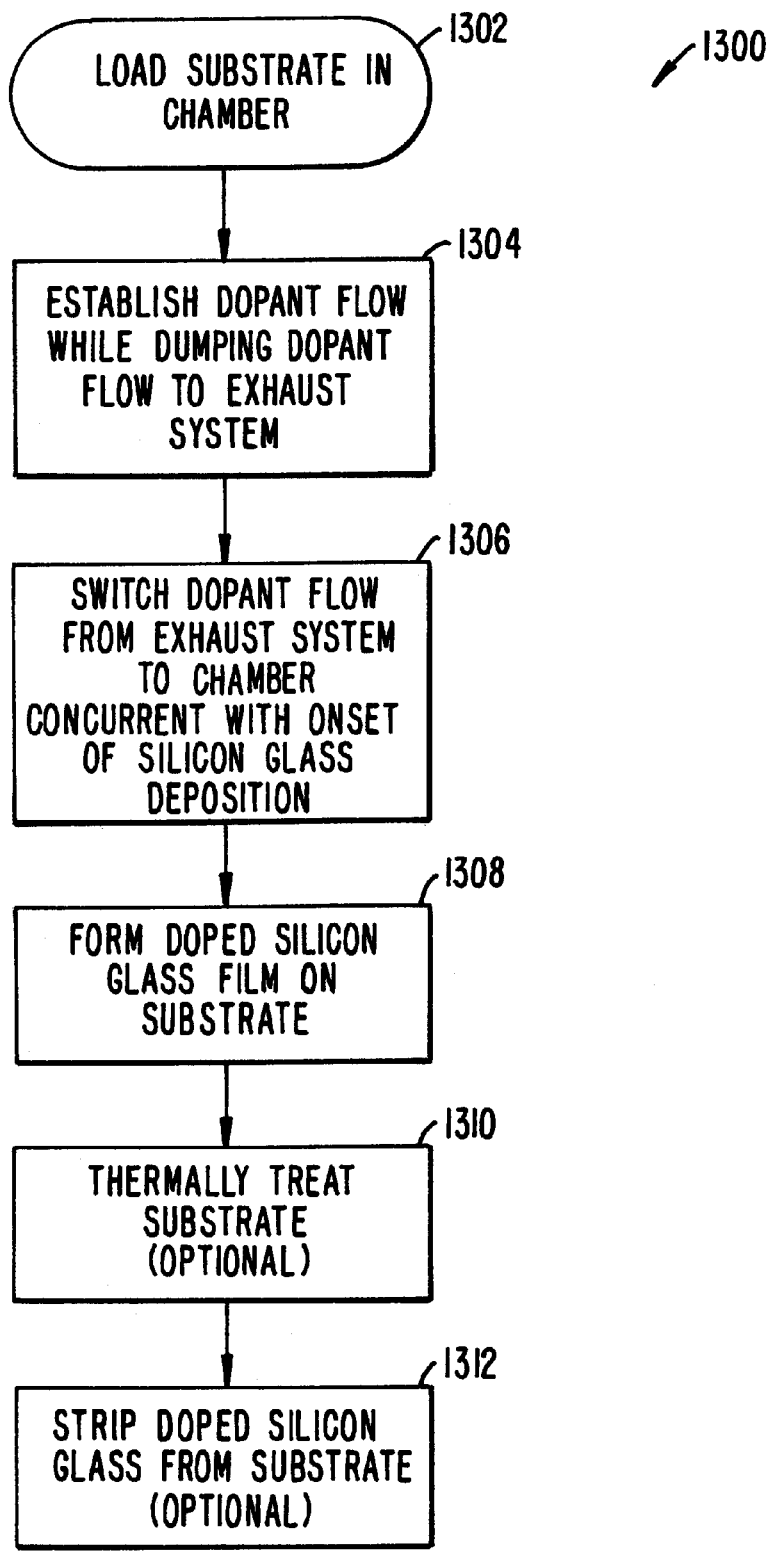
FIG. 13 is a simplified flow chart of a method for forming a doped silicon glass layer without a dopant deficient region, according to an embodiment of the present invention.

FIG. 13 is a flow chart of a method of producing a doped silicon glass film 1300 using a bypass technique. A substrate, such as a silicon wafer, is placed in a vacuum chamber (step 1302). A dopant flow is established (step 1304) by flowing the dopant and carrier to the vacuum system. The dopant flow is switched to the vacuum chamber as the deposition gases are flowed to the vacuum chamber (step 1306) and a layer of doped silicon glass without a dopant-deficient region is grown on the substrate (step 1308). Optionally, dopants from the doped silicon glass layer are driven into the substrate (step 1310) using a thermal treatment, and the doped silicon glass layer is stripped (step 1312).

While the above is a complete description of specific embodiments of the present invention, various modifications, variations, and alternatives may be employed. For example, although a detailed example was provided relating to forming a BPSG layer in a trench as a pre-metal dielectric layer, the present invention may be applied to inter-metal dielectric layers. Similarly, using a bypass to avoid formation of a dopant-deficient region may be applied to other dopants than born, like phosphorous or arsenic. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A substrate processing apparatus, the apparatus comprising:

a processing chamber;

a gas delivery system configured to deliver a process gas to the processing chamber, the process gas including a dopant gas, and configured to selectively deliver the dopant gas to an exhaust system via a bypass, the exhaust system configured to provide a vacuum to the processing chamber and to exhaust gases from the apparatus, or to the processing chamber;

a heating system conifigured to heat a substrate within the processing chamber;

a controller configured to control the gas delivery system, the heating system, and the exhaust system; and a memory, coupled to the controller, comprising a computer-readable medium having a computer-readable program embodied therein for directing operation of the gas delivery system, the heating system, and the exhaust system, the computer-readable program including:

(i) a first set of computer instructions for controlling the gas delivery system to flow the dopant gas to the exhaust system to establish a flow of the dopant gas via the bypass to the exhaust system; and (ii) a second set of computer instructions for controlling the gas delivery system to flow an oxygen source and deposition gas comprising a silicon source to the processing chamber, and to switch at least a portion of the flow of dopant gas from the exhaust system to the processing chamber, and to control the exhaust system to establish and maintain a pressure in the processing chamber appropriate for performing a chemical vapor deposition process of a doped silicon glass on the substrate.

2. The apparatus of claim 1 wherein the computer-readable program further includes a third set of computer instructions for controlling the heating system to heat the substrate during deposition of the doped silicon glass on the substrate.

3. The apparatus of claim 1 wherein the computer-readable program further includes a fourth set of computer instructions for controlling the heating system to heat the substrate to a temperature of at least about 600° C. after deposition of the doped silicon glass on the substrate.

* * * * *